(12) United States Patent
Iyer

(10) Patent No.: US 8,970,241 B2
(45) Date of Patent: Mar. 3, 2015

(54) DEVICE RETENTION FOR TEST SOCKET

(75) Inventor: Sanjay Iyer, Watsonville, CA (US)

(73) Assignee: Apple Inc., Cupertino, CA (US)

(*) Notice: Subject to any disclaimer, the term of this patent is extended or adjusted under 35 U.S.C. 154(b) by 695 days.

(21) Appl. No.: 13/051,491

(22) Filed: Mar. 18, 2011

(65) Prior Publication Data

US 2012/0235700 A1   Sep. 20, 2012

(51) Int. Cl.
*G01R 31/00* (2006.01)
*G01R 1/04* (2006.01)

(52) U.S. Cl.
CPC ............ *G01R 1/0458* (2013.01); *G01R 1/0466* (2013.01)
USPC ..................................... 324/756.02

(58) Field of Classification Search
USPC .................. 324/756.01–757.05; 439/71, 331, 439/525–537, 66–70
See application file for complete search history.

(56) References Cited

U.S. PATENT DOCUMENTS

| | | | |
|---|---|---|---|
| 5,967,798 A | | 10/1999 | Tustaniwskyj |
| 6,086,387 A | * | 7/2000 | Gallagher et al. ............ 439/71 |
| 6,746,261 B2 | | 6/2004 | Petit |
| 7,029,288 B2 | * | 4/2006 | Li ................................ 439/66 |
| 7,119,559 B2 | | 10/2006 | Beaucage |
| 7,514,946 B2 | * | 4/2009 | Soeta et al. ............ 324/750.09 |
| 7,755,378 B2 | | 7/2010 | Chang |
| 2008/0315407 A1 | * | 12/2008 | Andrews et al. ............ 257/735 |

* cited by examiner

*Primary Examiner* — Melissa Koval
*Assistant Examiner* — Trung Nguyen
(74) *Attorney, Agent, or Firm* — Meyertons, Hood, Kivlin, Kowert & Goetzel, P.C.

(57) ABSTRACT

Structures and techniques for restraining devices for testing. Test sockets may retain devices under test using one or more retention members protruding from sidewalls of the test sockets. Retained devices may be oriented such that contact arms may traverse horizontally to access the devices to, for example, provide desired testing environments. Devices may be retained by forces applied by the retention members to the retained devices in response to displacement, such as compression or deformation, of the retention members caused by the retained devices. Retention of the devices may be achieved without the need for additional fasteners, claims, or adjustment.

21 Claims, 6 Drawing Sheets

DEVICE RETENTION FOR TEST SOCKET

BACKGROUND

1. Technical Field

This disclosure relates generally device testing, and more particularly to test sockets.

2. Description of the Related Art

Test sockets may be used to retain a device under test, such as an integrated circuit, to facilitate characterization of the device under various conditions. For example, performance of the device may be characterized by analyzing data communicated as the retained device is subjected to specified testing conditions, such as various thermal conditions.

An integrated circuit device generally has a large footprint as compared to height. For example, even three-dimensional integrated circuits and three-dimensional packaged devices generally have large bottom surface dimensions (e.g., at a ball grid array connector-side surface of a device) and large top surface dimensions (e.g., at a surface opposite the connector-side surface) as compared to the device height. Thus, application of a thermal input to a top surface of a device is an efficient method for providing thermal loads for testing the device.

Present test sockets may be configured to restrain a device in a horizontal orientation in which the connector-side surface of the device faces downward, and to allow application of a thermal load to the device via a contact arm that may be automated to access the device by translating in a downward direction to interface with the top surface of the device. In such a horizontal device orientation, gravity serves to keep the device within the test socket.

SUMMARY

Various techniques and structures are disclosed that facilitate retention and testing of devices, such as integrated circuits. In certain embodiments, the disclosed techniques and structures may facilitate efficient testing by retaining a device under test in an orientation that may accommodate access by a structure, such as a contact arm, traversing in a non-downward direction to contact the retained device. For example, particular embodiments may retain a device under test in a vertical orientation, such that a connector side of the device (e.g., a side having a ball grid array, a pin grid array, or other connector) faces sideways, and the side of the retained device opposite the connector side is contacted by a horizontally-traversing contact arm.

Some embodiments of the present disclosure facilitate testing of two or more vertically-oriented devices that are positioned within test sockets with the devices' connectors facing each other to allow efficient coupling of the devices. For example, one such embodiment facilitates testing of a system-on-a-chip (SOC) and one or more separate memory devices coupled to the SOC for testing purposes. Two or more horizontally traversing contact arms may be employed to provide a controlled thermal test environment to the SOC and to the one or more memory devices.

Some embodiments may facilitate restraining a device under test such that the device's connector side is oriented facing upward, and an upward-traversing contact arm is used to interface with the restrained device.

Various embodiments include test sockets having retention members that protrude from sidewalls of the test sockets. These retention members (which may number one, two, three, four, or more per test socket) may apply forces that contribute to retaining a device in a test socket. Particular embodiments include a retention member constructed from a compressible material (e.g., an elastomer) that may apply a force in response to a compression of the retention member caused by insertion of a device in a test socket. Some embodiments include retention members having springs (e.g., a spring clip having a protective coating) that apply forces to the retained devices in response to compression or extension of the spring. The devices may be retained within the test sockets as a result of the forces applied by the retention members, without the need for subsequent clamping, fastening, or adjustment of the test sockets. The retention members may provide sufficient force to retain devices within test sockets in orientations in which gravity would otherwise cause the devices to dislodge (e.g., vertical, upside down).

BRIEF DESCRIPTION OF THE DRAWINGS

The following detailed description makes reference to the accompanying drawings, which are now briefly described.

Figure 1:
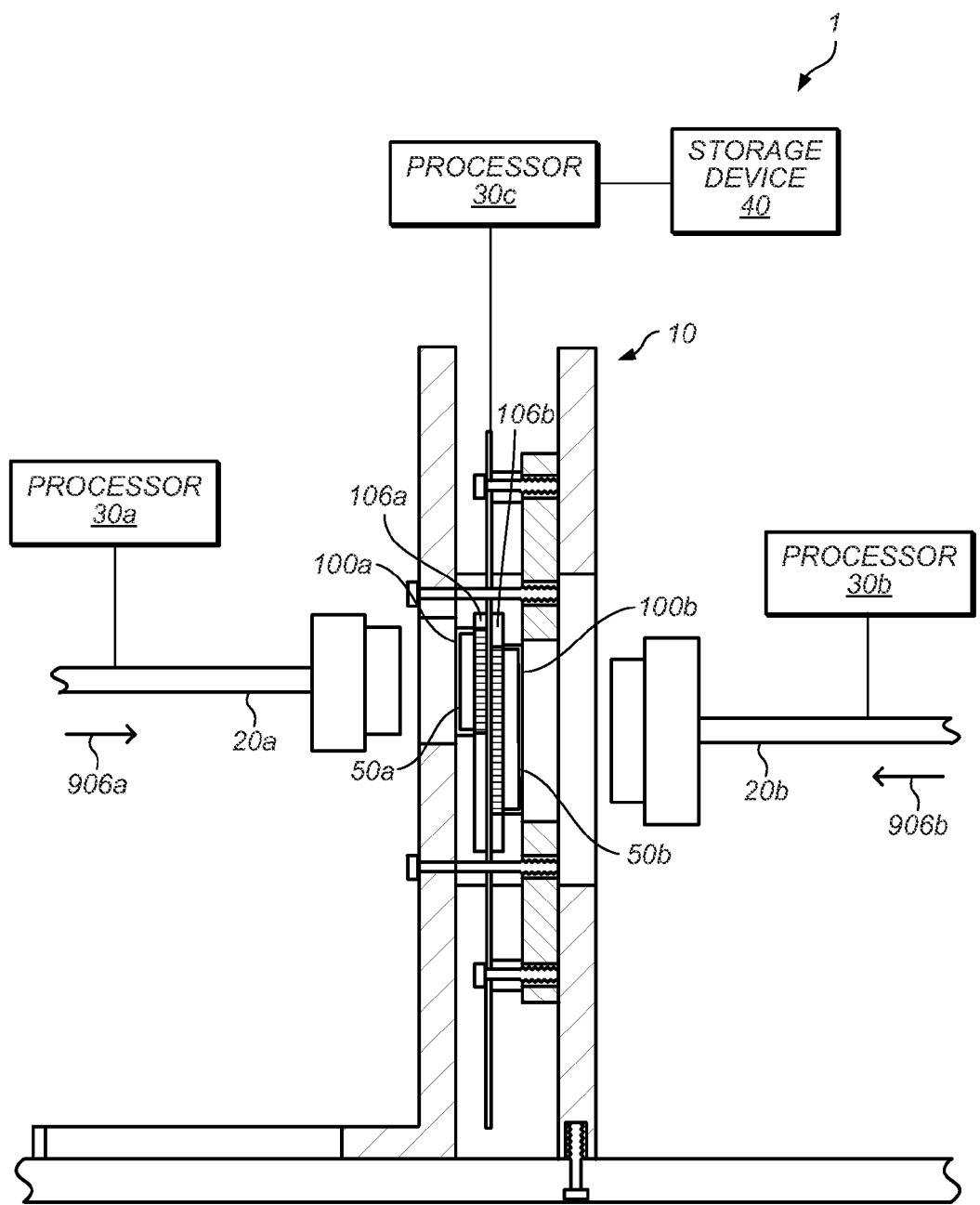
FIG. 1 depicts a testing system in accordance with one embodiment of the present disclosure. The depicted testing system includes two vertically-oriented test sockets and two contact arms.

Specific embodiments are shown by way of example in the drawings and will be described herein in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," "includes," "have," "having," and "has" are open-ended, and do not denote that an element is limited to features that are described as being "included" in the element or to features that an element is described as "having."

Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a retention member may be configured to apply a force in response to displacement of the retention member, even when the retention member is not experiencing a displacement). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

Various components may be described as performing a task or tasks, for convenience in the description. Such descriptions should be interpreted as including the phrase "configured to." Reciting a component that is configured to perform one or more tasks is expressly intended not to invoke 35 U.S.C. §112, paragraph six, interpretation for that component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION OF EMBODIMENTS

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Turning to FIG. 1, an illustration of an embodiment of testing system 1 that facilitates testing of device under test (DUT) 50a and DUT 50b is shown. As depicted, testing system 1 includes contact arm 20a and contact arm 20b that may be used to interface with DUT 50a and DUT 50b during testing. For example, contact arms 20 may include pistons traversing along paths 906 to contact DUTs 50 to provide thermal inputs required for a particular test profile. As another example, contact arms 20 may traverse along paths 906 to contact or be placed near DUTs 50 to provide a specified electro-magnetic environment for interference testing (EMI testing) of DUTs 50. Contact arm 20a and contact arm 20b may be controlled by processor 30a and processor 30b. In some embodiments, both contact arms 20 may be controlled by a single processor 30. In other embodiments, additional processors may be employed. Some embodiments may be configured to retain more than two DUTs 50, or only one DUT 50. Additional or fewer contact arms 20 may also be employed, and in some instances the correspondence between contact arms 20 and retained DUTs 50 may not be one-to-one (e.g., multiple contact arms 20 may be provided for one retained DUT 50).

In the embodiment depicted in FIG. 1, test apparatus 10 includes test socket 100a that is configured to retain DUT 50a, test socket 100b that is configured to retain DUT 50b, connector module 106a that facilitates communication with retained DUT 50a during testing, and connector module 106b that facilitates communication with retained DUT 50b during testing. Processor 30c and storage device 40 may be used to process and store information received from DUTs 50 via connector modules 106 during testing. Some embodiments may employ a single processor in place of the processors 30a-c depicted in FIG. 1. In some embodiments, a single integrated connector module 106 may be used to facilitate communication with both DUT 50a and DUT 50b (as well as any additional DUTs 50 that may be retained in that embodiment). In some embodiments, connector modules 106 may be integral to test apparatus 10.

The embodiment of FIG. 1 facilitates simultaneous testing of multiple coupled DUTs 50. For example, DUT 50a may be a system-on-a-chip (SOC) that is configured for operation with DUT 50b that is an external memory. Thus, it may be desirable to couple DUT 50a to DUT 50b during testing in order to most closely match a production configuration. Connector module 106a and connector module 106b (or, as described above, a single integrated connector module 106) may provide coupling between connectors of DUT 50a and DUT 50b, as well as coupling between DUTs 50 and processor 30c and/or storage device 40. Various embodiments of connector module 106 may include ball grid array (BGA), pin grid array (PGA), land grid array (LGA), dual in-line package (DIP), or other suitable connector form factors for interfacing with particular embodiments of DUT 50. Embodiments of test apparatus 10 may include multiple connector modules 106 having differing connector types.

The arrangement of test socket 100a and test socket 100b in the embodiment depicted in FIG. 1 provides for simplified, efficient coupling of DUT 50a and DUT 50b. The depicted vertical orientation of test socket 100a and test socket 100b results in DUT 50a and DUT 50b being oriented such that the devices' connectors face each other, and therefore facilitates coupling between connector module 106a and connector module 106b that are very closely spaced, or alternately use of a single integrated connector module 106 to interface with both DUT 50a and DUT 50b. Thus, the testing environment provided by test apparatus 10 can closely match a production configuration for a system that uses DUT 50a and DUT 50b, such that noise attributable to the testing configuration (e.g., noise experienced in a testing configuration due to artificially long signal paths that are not present in a production configuration) can be eliminated.

Figure 3:
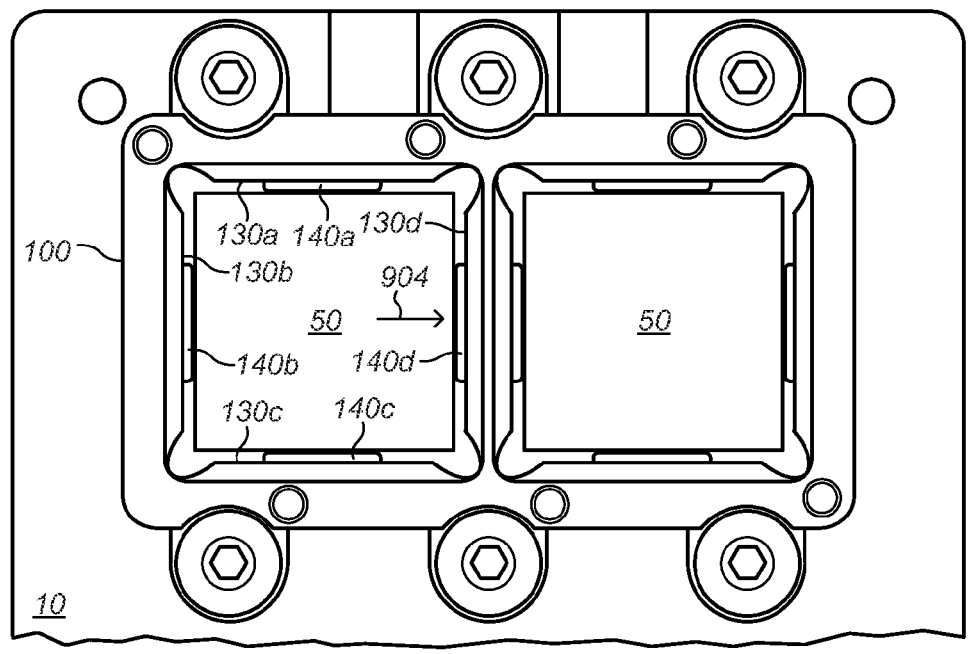
FIG. 3 is a plan view of an embodiment of a test socket retaining an integrated circuit. Four retention members are included in the depicted embodiment.
Figure 4:
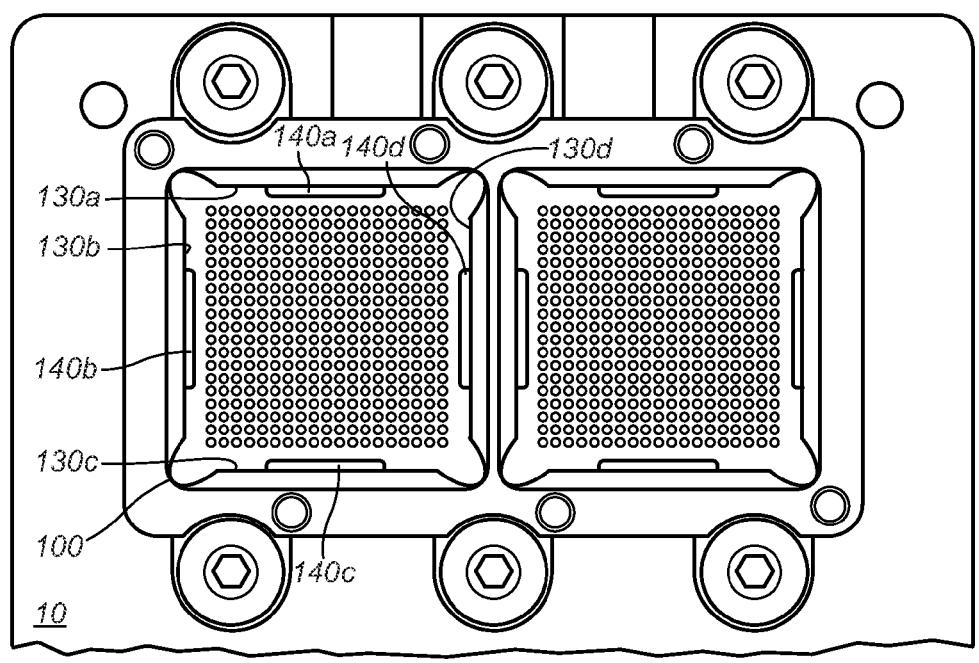
FIG. 4 is a plan view of an embodiment of a test apparatus that includes dual test sockets, each having four retention members.
Figure 5:
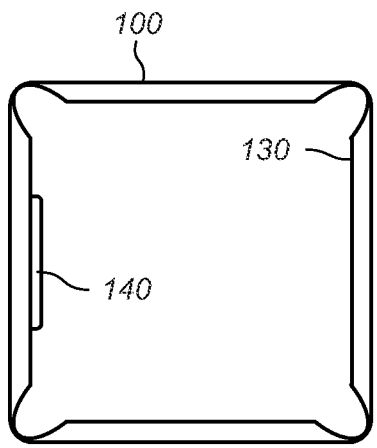
FIG. 5 depicts an embodiment of a test socket that includes one retention member.
Figure 6:
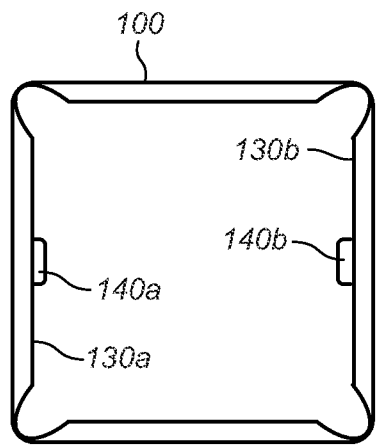
FIG. 6 depicts an embodiment of a test socket that includes two retention members, disposed at oppose sidewalls.
Figure 7:
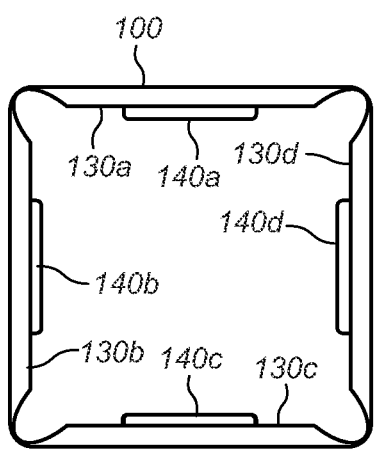
FIG. 7 depicts an embodiment of a test socket that includes four retention members.
Figure 8:
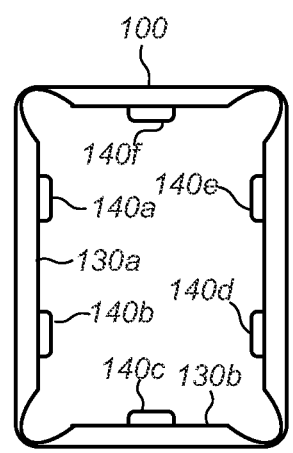
FIG. 8 depicts an embodiment of a test socket that includes six retention members.

Turning now to FIG. 3, an embodiment for retaining DUT 50 that causes displacements 904 of retention members 104 within test apparatus 10 is depicted. Insertion of DUT 50 into test socket 100 may cause displacement 904a of retention member 40a and displacement 904b of retention member 140b. In some embodiments, retention members 140 may be constructed from a compressible material, and displacements 904 may be partially or completely a product of compression of the compressible material. Thus, displacement 904 may be a result of a compression-caused deformation of a portion of retention member 140, without involving an actual translation of a retention member 140 other than the experienced deformation. Such a deformation may result in a force, having a component normal to sidewall 103 from which retention member 140 protrudes, to be exerted upon DUT 50 to provide a retention force. In some of these embodiments, the compressible material may be an elastomer selected to correspond to desired retention force and to be suitable to the testing environment experienced by test socket 100 (e.g., thermal testing cycles, chemical environments, suitability for physical interface to DUT 50).

Other embodiments may include retention members 140 constructed from a non-compressible material, such that displacements 904 may be partially or completely a product of deformation of the non-compressible material (e.g., a spring clip mechanism with a suitable protective coating). Appropriate selection of materials and geometry of these retention members 140 may provide desired retention force and suitability to the testing environment.

Embodiments may include retention member 140 that provides sufficient force to retain DUT 50 within test socket 100 in orientations where gravity would otherwise cause DUT 50 to dislodge, such as vertical or upside-down orientations. Test socket 100 and retention member 140 may be designed such that dimensional variation in DUT 50 due to manufacturing tolerances is accounted for, and insertion and removal of DUT 50 to/from test socket 100 by human operators and/or factory automation (e.g., a pick-and-place robot) may be accommodated. For example, a particular embodiment of test socket 100 may include two retention members 140 that retain DUT 50 with sufficient force to secure DUT 50 within test socket 100 in a vertical orientation (or in an inverted orientation in some embodiments), while facilitating insertion and removal of DUT 50 from test socket 100 using a vacuum chip picker. Retention of DUT 50 within test socket 100 may be achieved by forces exerted by retention members 140 in response to insertion of DUT 50, without the need for additional clamping, fastening, or further adjustment of test socket 100.

Turning to FIG. 3, an embodiment of test apparatus 10 that includes test socket 100 configured to retain two DUTs 50 side-by-side is shown. In this embodiment, each DUT 50 is retained by four retention members 140 protruding from the sidewalls 130. FIG. 3 depicts the same test socket 100 without the retained DUTs 50.

Figure 2:
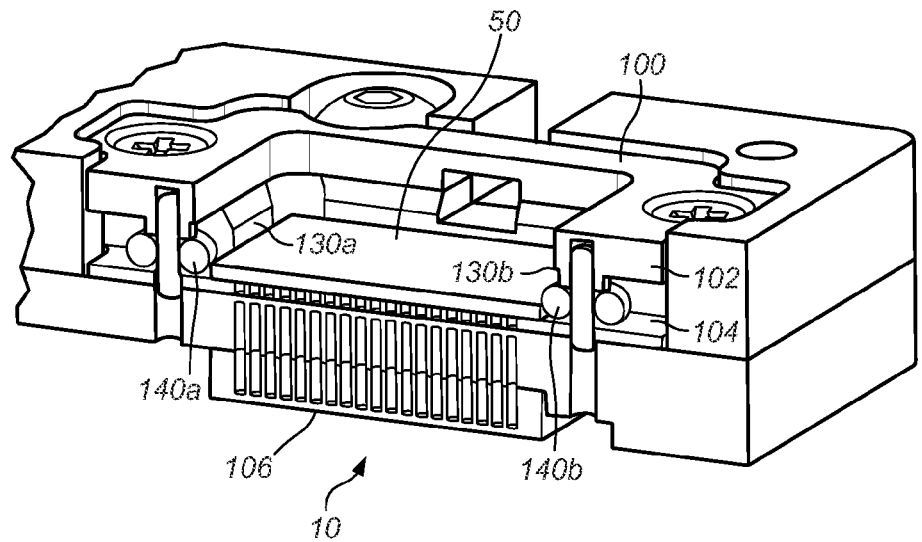
FIG. 2 is a perspective cross-sectional view of an embodiment of a test socket retaining an integrated circuit. The cross sections of two compressed retention members are depicted.

Returning to FIG. 2, test socket 100 may include top plate 102 and bottom plate 104 that provide mounting for retention members 140. Such a configuration may allow removal of test socket 100 (including retention members 140) from test apparatus 10 while allowing connector module 106 to remain secured to test apparatus 10. Thus, periodic replacement of retention members 140 may be accomplished without requiring the handling of connector module 106. Because certain configurations of connector module 106 may be easily damaged, the ability to periodically replace retention member 140 without removing connector module 106 is desirable. In the depicted embodiment, test socket 100 may be removed from test apparatus 10 as a unit. Subsequently, top plate 102 may be separated from bottom plate 104 to allow access to retention member 140a and retention member 140b for inspection and/or replacement.

Referring now to FIGS. 5-8, various configurations of test socket 100 are shown. Embodiments of test socket 100 may include various configurations of retention members 140 for retaining DUT 50. Within a particular embodiment of test socket 100, retention members 140 may be symmetrically or asymmetrically arranged. Configurations may include various numbers of retention members 140, as well as similar or different dimensions for each retention member 140 within a particular test socket 100.

Figure 9:
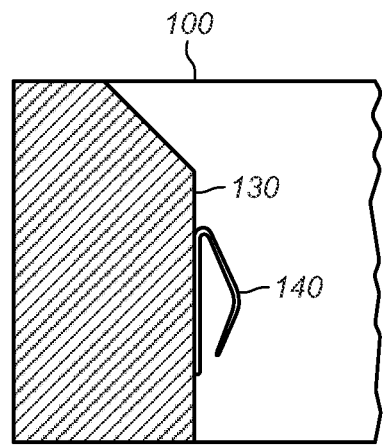
FIG. 9 is a cross-sectional detail view depicting an embodiment that includes a spring clip-type retention member

Turning now to FIG. 9, a cross-sectional view of an embodiment having retention member 140 that is a spring clip-type mechanism is depicted. Material selection and geometry definition of retention member 140 may provide a desired retention force, and may provide favorable performance in a testing environment. For example, one embodiment of retention member 140 may include a metal that is coated such that retained DUT 50 is not damaged from interface with retention member 140.

Figure 10:
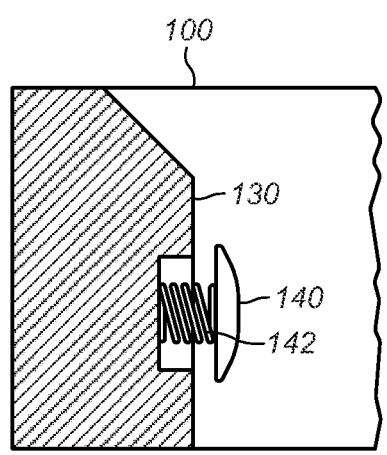
FIG. 10 is a cross-sectional detail view depicting an embodiment having a retention member that includes a spring and a pad.

FIG. 10 illustrates an embodiment in retention member 140 that includes spring 142 configured to exert a force on a retained DUT 50 via a protective bumper. The protective bumper may be constructed of a suitable material (e.g., polyoxymethylene, polytetrafluoroethylene) that may provide desirable characteristics for interfacing with the retained DUT 50.

Figure 11:
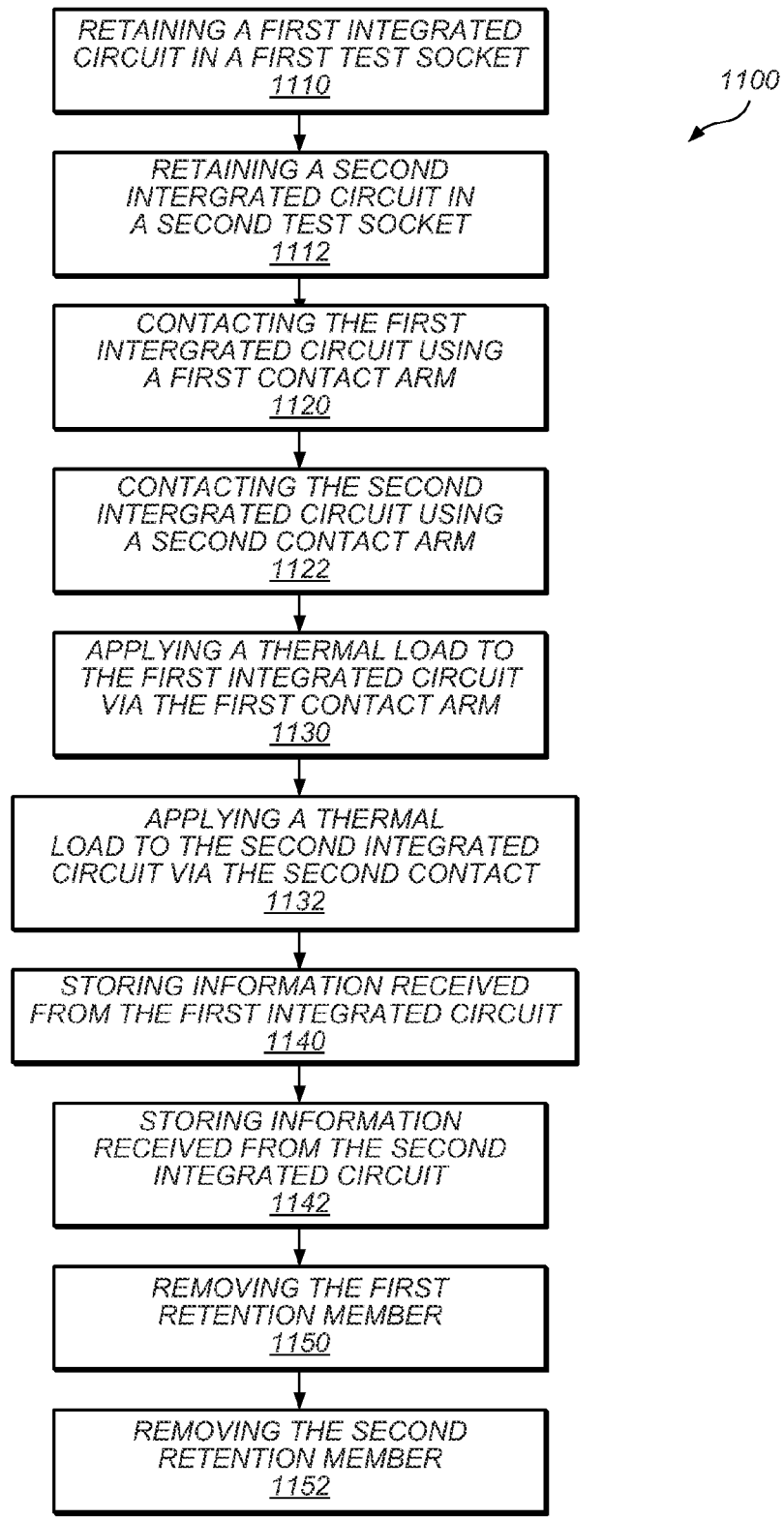
FIG. 11 is a flowchart illustrating operation of one embodiment of a test system.

Turning now to FIG. 11, a flowchart of method 1100 that may be performed using test apparatus 10 is depicted. In step 1110, a first integrated circuit may be retained in a first test socket. The first integrated circuit may be retained using a first retention member that protrudes from a first sidewall of the first test socket. In some embodiments, the first retention member may be constructed from a compressible material, and displacement of the retention member (e.g., by way of compression of the compressible material) may result in a force, having a component normal to the first sidewall, to be exerted upon the integrated circuit to provide a retention force. In some of these embodiments, the compressible material may be an elastomer. In some embodiments, the first retention member may be constructed from a non-compressible material, such that deformation of the non-compressible material may provide a retention force.

Some embodiments may include a second retention member protruding from the first sidewall, or from another sidewall, of the first test socket. The second retention member may also apply a force that contributes to retention of the integrated circuit. Some embodiments may include additional retention members that apply forces contributing to retention of the integrated circuit in the first test socket.

Step 1112 includes retaining a second integrated device in a second test socket. Retention of the first integrated device and the second integrated device may result from an operator or an automated process, such as a pick-and-place robot, inserting the integrated circuits within the test sockets with sufficient force to cause displacement (e.g. compression, deformation) of retention members. In some embodiments, additional test sockets may be used to retain additional integrated circuits for testing. Retention may be accomplished without the need for additional fasteners, claims, or other retention mechanisms.

Steps 1120 and 1122 include contacting the first and second integrated circuits retained within the test sockets by using first and second contact arms. The contact arms may be used to achieve a desired testing environment by, for example, applying thermal loads to the first and second integrated circuits (steps 1130 and 1132), or to additional integrated circuits that may be retained in some embodiments.

Testing of the retained integrated circuits under the provided testing environment may be performed, and data may be collected and stored (steps 1140 and 1142). A storage device that employs a magnetic hard drive, solid-state hard drive, optical media, volatile memory, non-volatile memory, or other recordable media may be used for storing the collected test data.

Testing may include performance of a testing suite that includes cycling through several different environments, such as operation of the retained integrated circuits over various thermal conditions. Such thermal cycling may lead to degradation of the material of the retention members. Thus, removal and replacement of one or more retention members may be periodically required (steps 1150 and 1152). Embodiments of the present test systems may facilitate removal and replacement of the retention members from the testing systems without requiring removal of potentially fragile connectors. Such removal may be facilitated by configurations having removable test sockets that allow access to the retention members.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A test socket, comprising:
a plurality of sidewalls configured to receive an integrated circuit during testing of the integrated circuit such that the integrated circuit is removable from the test socket following testing;
a first retention member protruding from a first sidewall of the plurality of sidewalls, the first retention member being configured to apply a force in response to displacement of the first retention member relative to the first sidewall, the force applied by the first retention member including at least a component normal to the first sidewall; and
a second retention member protruding from a second sidewall of the plurality of sidewalls that is disposed opposite of the first sidewall;
wherein the test socket is configured to retain the integrated circuit within the test socket in response to insertion of the integrated circuit within the test socket with sufficient force to cause the displacement of the first retention member and displacement of the second retention member.

2. The test socket of claim 1,
wherein the second retention member is configured to apply a force in response to the displacement of the second retention member relative to the second sidewall, the force applied by the second retention member including at least a component normal to the second sidewall.

3. The test socket of claim 1, further comprising:
a connector module configured to facilitate electrical coupling to the integrated circuit retained within the test socket;
wherein the first retention member comprises a compressible material, and wherein the displacement of the first retention member is provided at least in part by compression of the compressible material; and
wherein the test socket is configured to facilitate removal of the plurality of sidewalls and the first retention member from the test socket without removing of the connector module.

4. The test socket of claim 3, further comprising:
a top plate; and
a bottom plate;
wherein the test socket is configured to facilitate the removal of the plurality of sidewalls and the first retention member from the test socket without removing the connector module by removing the top plate and the bottom plate from the test socket.

5. The test socket of claim 4, wherein the test socket is configured to facilitate removal of the first retention member via separating the top plate from the bottom plate, and where the compressible material is a thermoplastic elastomer.

6. The test socket of claim 1, wherein the test socket is configured to:

retain the integrated circuit within the test socket in a vertical orientation that facilitates access to the integrated circuit retained within the test socket from a horizontal direction by a contact arm.

7. The test socket of claim 1, the test socket having a plate perpendicular to at least one of the plurality of sidewalls, the plate includes a connector module, wherein the test socket is configured to retain the integrated circuit within the test socket during testing of the integrated circuit such that the plate is in a vertical orientation.

8. A test apparatus, comprising:
a first test socket including a first retention member protruding from a first sidewall of the first test socket, the first sidewall of the first test socket being configured to receive a first integrated circuit during testing of the first integrated circuit such that the first integrated circuit is removable from the first test socket following testing, and the first retention member being configured to apply a force in response to displacement of the first retention member relative to the first sidewall of the first test socket, the force applied by the first retention member including at least a component normal to the first sidewall of the first test socket, wherein the first test socket is configured to retain the first integrated circuit within the first test socket using the first retention member;
a second test socket including a second retention member protruding from a first sidewall of the second test socket, the first sidewall of the second test socket being configured to receive a second integrated circuit during testing of the second integrated circuit such that the second integrated circuit is removable from the second test socket following testing, and the second retention member being configured to apply a force in response to displacement of the second retention member relative to the first sidewall of the second test socket, the force applied by the second retention member including at least a component normal to the first sidewall of the second test socket, wherein the second test socket is configured to retain the second integrated circuit within the second test socket using the second retention member;
a third retention member protruding from a second sidewall of the first test socket, the second sidewall of the first test socket being configured to receive the first integrated circuit during testing of the first integrated circuit such that the first integrated circuit is removable from the first test socket following testing, and the third retention member being configured to apply a force in response to displacement of the third retention member relative to the second sidewall of the first test socket, the force applied by the third retention member including at least a component normal to the second sidewall of the first test socket, wherein the first test socket is configured to retain the first integrated circuit within the first test socket further using the third retention member; and
a fourth retention member protruding from a second sidewall of the second test socket, the second sidewall of the second test socket being configured to receive the second integrated circuit during testing of the second integrated circuit such that the second integrated circuit is removable from the second test socket following testing, and the fourth retention member being configured to apply a force in response to displacement of the fourth retention member relative to the second sidewall of the second test socket, the force applied by the fourth retention member including at least a component normal to the second sidewall of the second test socket, wherein the second test socket is configured to retain the second integrated circuit within the second test socket further using the fourth retention member.

9. The test apparatus of claim 8, further comprising:
one or more connector modules configured to provide electrical coupling to the first and the second integrated circuits respectively retained within the first and the second test sockets;
wherein the test apparatus is configured to facilitate removal of the first retention member and the second retention member from the test apparatus without removing the one or more connector modules from test apparatus.

10. The test apparatus of claim 8,
wherein the first retention member comprises a first compressible material, wherein the second retention member comprises a second compressible material, wherein the displacement of the first retention member is provided at least in part by compression of the first compressible material, wherein the displacement of the second retention member is provided at least in part by compression of the second compressible material, and wherein the test socket is configured to:
retain the first integrated circuit within the first test socket in response to insertion of the first integrated circuit within the first test socket with sufficient force to cause the displacement of the first retention member; and
retain the second integrated circuit within the second test socket in response to the second integrated circuit insertion of the second test socket with sufficient force to cause the displacement of the second retention member.

11. The test apparatus of claim 8, wherein the test apparatus in configured to:
provide access to the first integrated circuit retained within the first test socket from a first direction by a first contact arm; and
provide access to the second integrated circuit retained within the second test socket from a second direction by a second contact arm, wherein the second direction is substantially opposite of the first direction.

12. A testing system comprising:
a processor;
a first contact arm; and
a first test socket including a first retention member protruding from a first sidewall of the first test socket, the first sidewall of the first test socket being configured to receive a first device under test during testing of the first device under test such that the first device under test is removable from the first test socket following testing, and the first retention member being configured to apply a force in response to displacement of the first retention member relative to the first sidewall of the first test socket, the force applied by the first retention member including at least a component normal to the first sidewall of the first test socket, wherein the first test socket is configured to retain the first device under test within the first test socket using the first retention member;
wherein the testing system is configured to contact the retained first device under test using the first contact arm translating along a first path, the first contact arm being controlled at least in part by the processor; and wherein the testing system further comprises:
a second contact arm; and
a second test socket including a second retention member protruding from a first sidewall of the second test socket, the first sidewall of the second test socket being configured to receive a second device under test during testing of the second device under test such that the second device under test is removable from the second test socket following testing, and the second retention member being configured to apply a force in response to displacement of the second retention member relative to the first sidewall of the second test socket, the force applied by the second retention member including at least a component normal to the first sidewall of the second test socket, wherein the second test socket is configured to retain the second device under test within the second test socket using the second retention member;
wherein the testing system is configured to contact the retained second device under test using the second contact arm translating along a second path having a different direction from a direction of the first path translated by the first contact arm, the second contact arm being controlled at least in part by the processor.

13. The testing system of claim 12, wherein:
the first test socket is configured to retain the first device under test in a substantially vertical orientation;
the first path translated by the first contact arm is a substantially horizontal path having a first direction;
the second test socket is configured to retain the second device under test in a substantially vertical orientation; and
the second path translated by the second contact arm is a substantially horizontal path having a second direction that is substantially opposite to the first direction.

14. The testing system of claim 12,
wherein the first retention member comprises a first compressible material, wherein the second retention member comprises a second compressible material, wherein the displacement of the first retention member is provided at least in part by compression of the first compressible material, wherein the displacement of the second retention member is provided at least in part by compression of the second compressible material, and wherein the test socket is configured to:
retain the first device under test within the first test socket in response to insertion of the first device under test within the first test socket with sufficient force to cause the displacement of the first retention member; and
retain the second device under test within the second test socket in response to insertion of the second device under test within the second test socket with sufficient force to cause the displacement of the second retention member.

15. The testing system of claim 12, further comprising:
a third retention member protruding from a second sidewall of the first test socket, the third sidewall being configured to receive the first device under test during testing of the first device under test such that the first device under test is removable from the first test socket following testing, and the third retention member being configured to apply a force in response to displacement of the third retention member relative to the second sidewall of the first test socket, the force applied by the third retention member including at least a component normal to the second sidewall of the first test socket, wherein the first test socket is configured to retain the first device under test within the first test socket further using the third retention member; and a fourth retention member protruding from a second sidewall of the second test socket, the fourth retention member being configured to apply a force to the second device under test in response to displacement of the fourth retention member relative to the second sidewall of the second test socket, the force applied by the fourth retention member including at least a component normal to the second sidewall of the second test socket, wherein the second test socket is configured to retain the second device under test within the second test socket further using the fourth retention member.

16. The testing system of claim 12, further comprising:
one or more connector modules configured for providing electrical coupling to the retained first device under test and the retained second device under test;
wherein the processor is configured to receive data via the one or more connector modules from the first device under test and from the second device under test, and wherein the first device under test comprises an integrated circuit.

17. The testing system of claim 16, further comprising a storage medium configured to store data received via the one or more connector modules from the first device under test and from the second device under test.

18. The testing system of claim 12, wherein the testing system is further configured to provide a thermal input to the retained first device under test, wherein the thermal input is based at least in part on information provided by the processor.

19. A method, comprising:
retaining a first integrated circuit in a first test socket, the retaining the first integrated circuit using a first retention member protruding from a first sidewall of the first test socket, the first sidewall of the first test socket receiving the first integrated circuit during testing of the first integrated circuit such that the first integrated circuit is removable from the first test socket following testing, and the first retention member applying a force to the first integrated circuit in response to displacement of the first retention member relative to the first sidewall of the first test socket;
retaining a second integrated circuit in a second test socket, the retaining the second integrated circuit using a second retention member protruding from a first sidewall of the second test socket, the first sidewall of the second test socket receiving the second integrated circuit during testing of the second integrated circuit such that the second integrated circuit is removable from the second test socket following testing, and the second retention member applying a force to the second integrated circuit in response to displacement of the second retention member relative to the first sidewall of the second test socket;
contacting the first integrated circuit using a first contact arm translating along a first path;
contacting the second integrated circuit using a second contact arm translating along a second path, the second path being substantially opposite in direction to the first path; and
storing information received from the first integrated circuit via a connection member of the first test socket, the connection member being coupled to the first integrated circuit.

20. The method of claim 19, further comprising:
applying a thermal load to the first integrated circuit via the first contact arm.

21. The method of claim 19, further comprising removing the first sidewall and the first retention member from the first test socket without removing the connection member from the first test socket.

* * * * *